(12) United States Patent
Smayling (10) Patent No.: US 7,965,382 B2
(45) Date of Patent: Jun. 21, 2011

(54) METHODS AND APPARATUS FOR MULTI-EXPOSURE PATTERNING

(75) Inventor: Michael C. Smayling, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 660 days.

(21) Appl. No.: 11/952,307

(22) Filed: Dec. 7, 2007

(65) Prior Publication Data

US 2008/0143983 A1 Jun. 19, 2008

Related U.S. Application Data

(60) Provisional application No. 60/869,275, filed on Dec. 8, 2006.

(51) Int. Cl.
*G03B 27/32* (2006.01)
*G03B 27/42* (2006.01)
(52) U.S. Cl. ............................................ 355/77; 355/53
(58) Field of Classification Search .................... 355/52, 355/53, 55, 67
See application file for complete search history.

(56) References Cited

U.S. PATENT DOCUMENTS

| 4,758,863 | A  | * | 7/1988  | Nikkel ............................. 355/40 |
| 5,439,764 | A  |   | 8/1995  | Alter et al. |
| 6,399,283 | B1 | * | 6/2002  | Hoshi ............................. 430/312 |
| 6,646,722 | B2 | * | 11/2003 | Pierrat ............................. 355/77 |
| 6,710,851 | B1 | * | 3/2004  | Elmer et al. ..................... 355/53 |
| 7,144,690 | B2 | * | 12/2006 | Van Itallie et al. ............. 430/396 |
| 2003/0197136 | A1 | | 10/2003 | Yoshida |
| 2003/0219675 | A1 | | 11/2003 | Montgomery et al. |

OTHER PUBLICATIONS

International Search Report and Written Opinion of International Application No. PCT/US07/25158 mailed on Mar. 10, 2008.
International Preliminary Report and Written Opinion of International Application No. PCT/US07/25158 mailed on Jun. 18, 2009.

* cited by examiner

*Primary Examiner* — Hung Henry Nguyen
(74) *Attorney, Agent, or Firm* — Dugan & Dugan, PC (57) ABSTRACT

In some aspects, a reticle is provided for use in forming a patterned region on a substrate using a multi-pattern, multi-exposure process. The reticle includes (a) a first pattern for the multi-pattern, multi-exposure process formed on a first region of the reticle; and (b) a second pattern for the multi-pattern, multi-exposure process formed on a second region of the reticle that is offset from first region of the reticle. Numerous other aspects are provided.

12 Claims, 9 Drawing Sheets

FIG. 6D

# METHODS AND APPARATUS FOR MULTI-EXPOSURE PATTERNING

The present application claims priority from U.S. Provisional Application Ser. No. 60/869,275, filed Dec. 8, 2006, which is hereby incorporated by reference herein in its entirety for all purposes.

FIELD OF THE INVENTION

The present invention relates to semiconductor device manufacturing, and more particularly to methods and apparatus for improved patterning of substrates, such as semiconductor wafers, glass substrates for flat panel displays, polymer substrates or the like.

BACKGROUND OF THE INVENTION

Multi-exposure patterning of a substrate may allow formation of device features that are smaller than those that may be provided using a single-exposure patterning process. However, multi-exposure patterning processes are time consuming, complicated and subject to alignment errors. As such, a need exists for improved methods and apparatus for multi-exposure patterning.

SUMMARY OF THE INVENTION

In a first aspect of the invention, a method is provided for forming a patterned region on a substrate using a multi-pattern, multi-exposure patterning process. The method includes (a) providing a reticle having at least a first pattern and a second pattern that are offset on the reticle; (b) positioning a substrate near the reticle; (c) exposing the substrate to the first and second patterns using the reticle, thereby defining a first region of the substrate exposed by the first pattern and a second region of the substrate exposed by the second pattern; (d) adjusting a position of the substrate relative to the reticle so as to align the second pattern of the reticle to the first region of the substrate exposed by the first pattern of the reticle; and (e) exposing the substrate to the first and second patterns using the reticle so that the first region of the substrate has been exposed to both the first pattern and the second pattern of the reticle.

In a second aspect of the invention, a reticle is provided for use in forming a patterned region on a substrate using a multi-pattern, multi-exposure process. The reticle includes (a) a first pattern for the multi-pattern, multi-exposure process formed on a first region of the reticle; and (b) a second pattern for the multi-pattern, multi-exposure process formed on a second region of the reticle that is offset from first region of the reticle.

In a third aspect of the invention, a reticle is provided for use in forming a patterned region on a substrate using a multi-pattern, multi-exposure patterning process. The reticle includes a plurality of offset patterns for the multi-pattern, multi-exposure process formed on the reticle. The reticle includes all patterns required for the multi-exposure patterning. Numerous other aspects are provided.

Other features and aspects of the present invention will become more fully apparent from the following detailed description, the appended claims and the accompanying drawings.

DETAILED DESCRIPTION

According to embodiments of the present invention, each of the patterns to be used in a multi-exposure patterning process (e.g., double exposure, triple exposure, quadruple exposure, etc.) is provided on a single reticle (referred to herein as a multi-pattern-multi-exposure (MPME) reticle). The MPME reticle may be exposed in a conventional manner, exposing the entire reticle field with each exposure. However, between exposures, the substrate being patterned is moved (e.g., with a stepper/scanner) by less than the field size of the MPME reticle. In some embodiments, the substrate is moved by a distance related to the inverse of the number of patterns on the MPME reticle (e.g., ½ of the reticle field size for two patterns, ⅓ of the reticle field size for 3 patterns, etc.). The entire reticle field is then exposed.

When the substrate is thus moved, an area of the substrate previously exposed by a first pattern of the MPME reticle is exposed by a (second) different pattern of the MPME reticle. The above described sub-reticle-field-size movement and exposure steps may be repeated for each pattern present on the MPME reticle. In this way, the MPME reticle is used to overlay multiple-patterns on the substrate so as to achieve complete multi-exposure patterning without requiring the use of multiple reticles.

The present invention may provide improvement over prior multi-exposure patterning techniques such as double exposure, triple exposure, quadruple exposure, etc., in that the multi-pattern-multi-exposure (MPME) reticle of the present invention is aligned to a substrate only once. The MPME reticle includes all patterns (e.g., lines) required for a multi-exposure patterning process so that a substrate may simply be moved beneath the MPME reticle by a stepper/scanner between exposure steps to allow the substrate to be exposed to each pattern of the multi-exposure patterning process (e.g., double exposure, triple exposure, quadruple exposure etc.). In conventional multi-exposure patterning processes, multiple reticles must be aligned with a substrate as each reticle includes only one pattern. Generally, the alignment of multiple patterns within a single reticle to a substrate by a stepper/scanner is more accurate than the alignment of multiple reticles to the substrate.

The present invention may reduce the number of process steps used during multi-exposure patterning when compared to prior methods of multi-exposure patterning (e.g., by reducing the number of photoresist coating, baking and/or developing steps). The present invention may also reduce the time from exposure until post-exposure bake, thereby improving critical dimension ("CD"). For example, because a substrate is exposed to all of the patterns of the inventive MPME reticle without having to align the substrate to multiple reticles, the time until post-exposure bake when an MPME reticle is employed is similar to the time until post-exposure bake for a conventional single exposure process.

Figure 1:
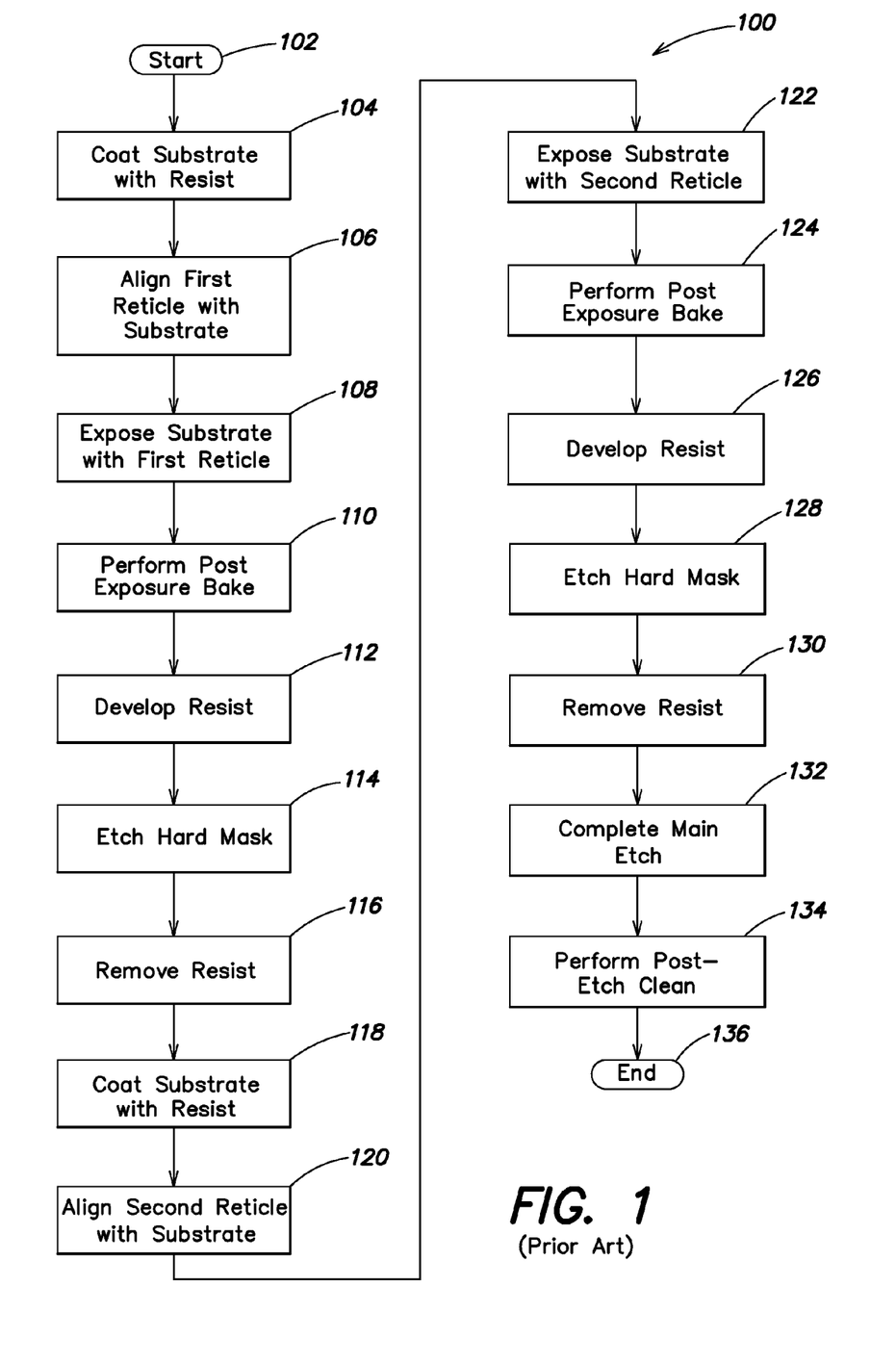
FIG. 1 depicts a conventional method of multi-exposure patterning.
Figure 2A:
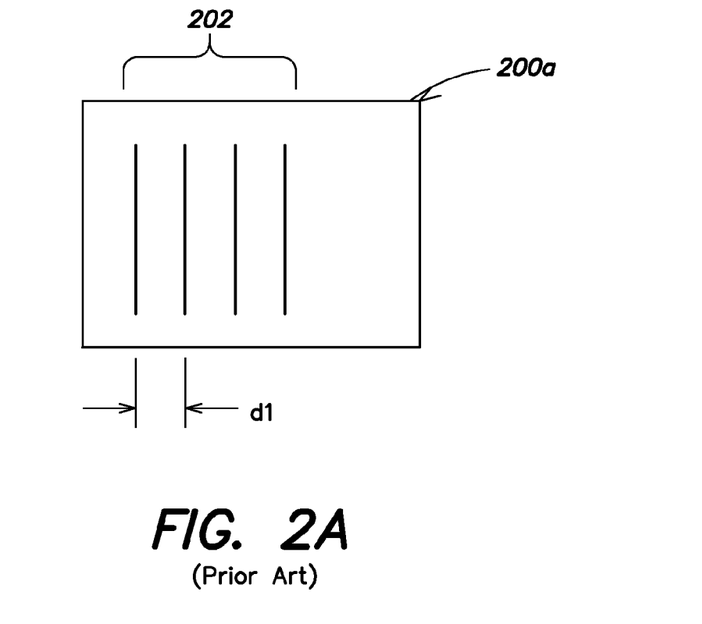
FIGS. 2A-2B are top views of a first reticle and a second reticle, respectively, for use in the conventional multi-exposure multi-reticle process of FIG. 1.
Figure 2B:
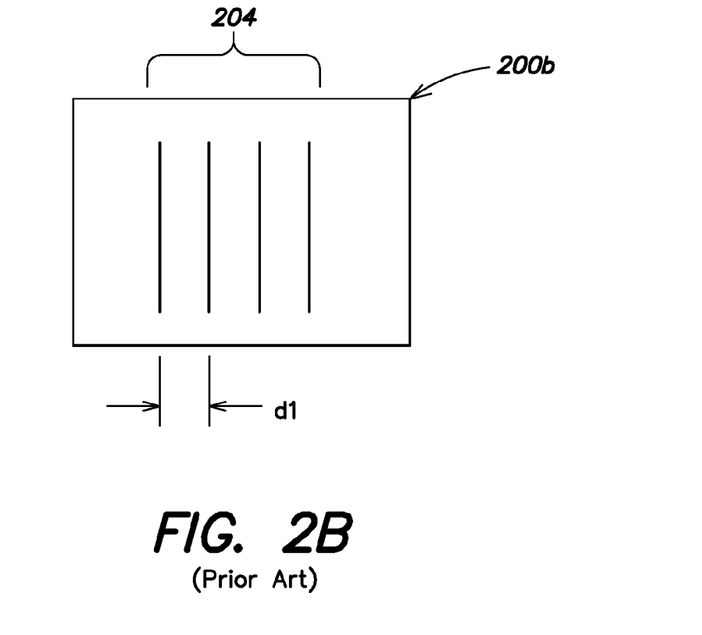
Figure 3A:
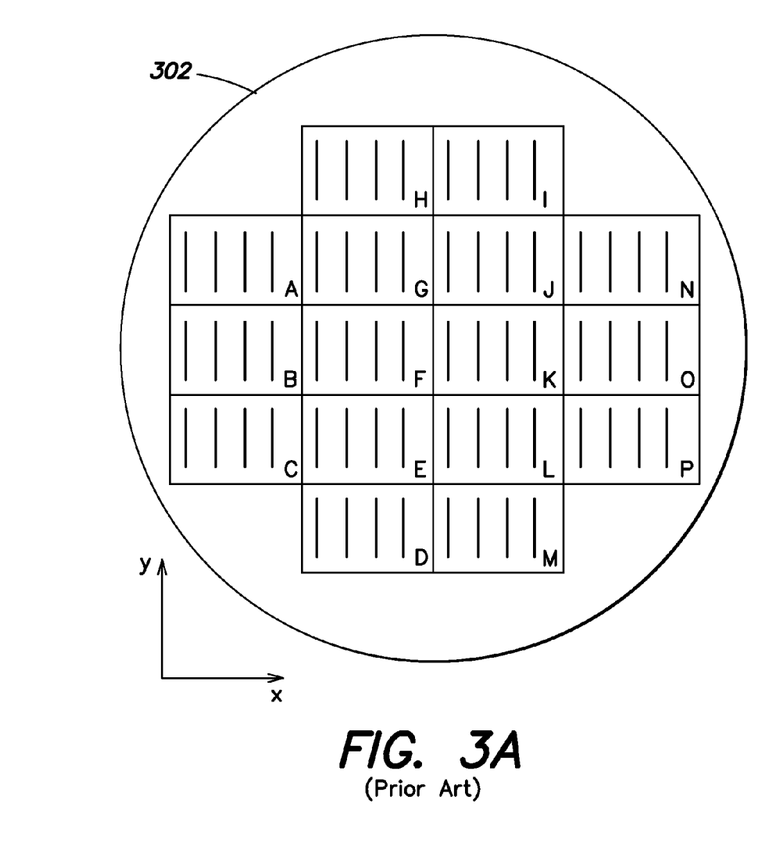
FIGS. 3A-3C are top views of a substrate during the multi-exposure multi-reticle process of FIG. 1
Figure 3B:
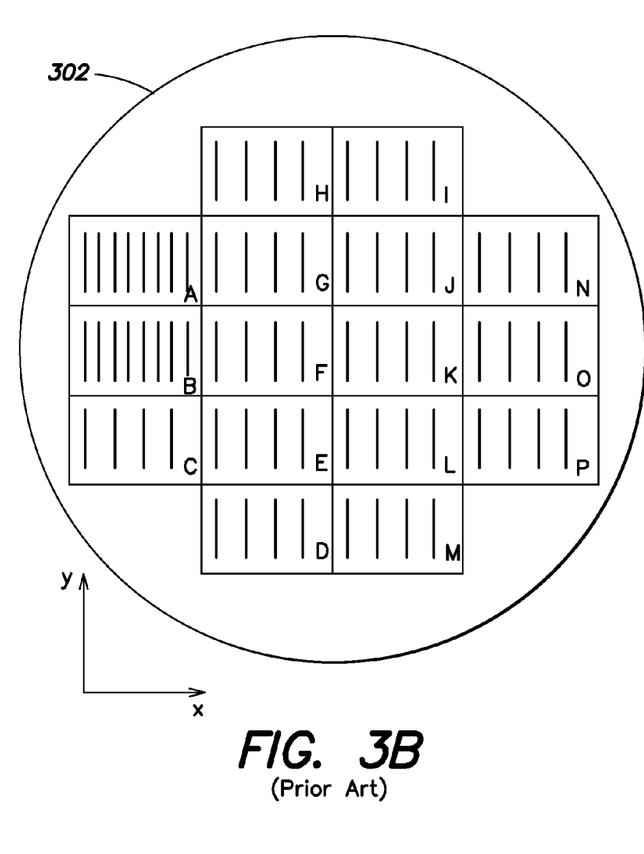
Figure 3C:
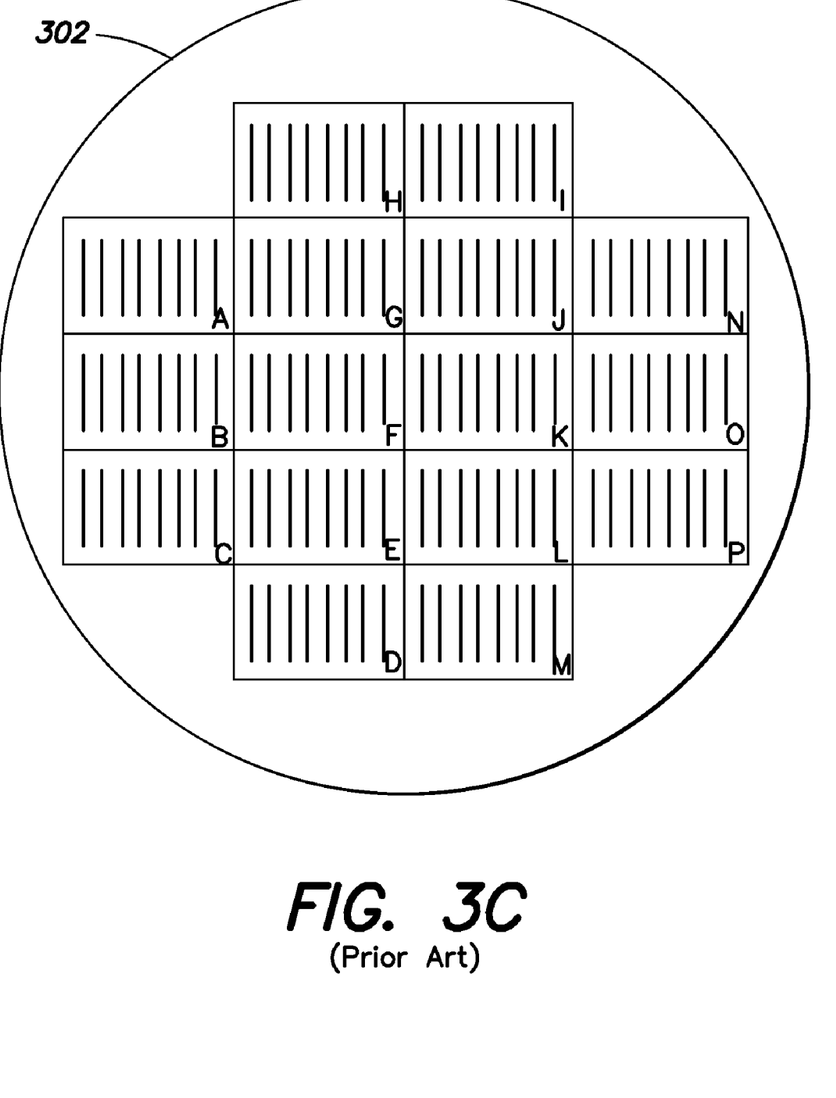

A conventional multi-exposure multi-reticle patterning process is now discussed with reference to FIGS. 1-3C. FIG. 1 depicts a conventional method 100 of multi-exposure patterning. FIGS. 2A-2B are top views of a first reticle 200a and a second reticle 200b, respectively, for use in the conventional multi-exposure multi-reticle process of FIG. 1. FIGS. 3A-3C are top views of a substrate 302 during the multi-exposure multi-reticle process of FIG. 1.

With reference to FIG. 1, the method 100 begins at step 102. In step 104, a substrate, such as substrate 302 of FIGS. 3A-3C, is coated with photo resist. In step 106, a first reticle, such as reticle 200a shown in FIG. 2A, is aligned with substrate 302. The alignment is accomplished, for example, with a stepper/scanner (not shown).

Reticle 200a has a first line pattern in which first lines 202 are spaced apart a distance $d_1$ on the reticle. Reticle 200b has a second line pattern in which second lines 204 are also spaced apart by the distance $d_1$. The first lines 202 of reticle 200a are offset from second lines 204 of reticle 200b shown in FIG. 2B by half the distance $d_1$. As such, if reticle 200a is placed atop reticle 200b, the first lines 202 lie between second lines 204, forming an overall line pattern with lines spaced by $d_1/2$.

In step 108, the substrate 302 is exposed using reticle 200a. A stepper/scanner moves the substrate 302 beneath reticle 200a and multiple exposures are performed until the substrate 302 has been exposed as shown in FIG. 3A, for example. In the example of FIG. 3A, reticle 200a may be used to expose section A of substrate 302. The substrate 302 may then be stepped by the size of the reticle 200a so that reticle 200a may be used to expose section B. Following exposure of section B, the substrate 302 may again be moved by the size of the reticle 200a to expose section C. This patterning may continue through sections D-P. Other orders of stepping/exposing the substrate 302 may be used.

In step 110, the substrate 302 (which has been exposed using reticle 200a) is removed from the stepper/scanner and baked. In step 112, the substrate 302 is developed. In step 114, the developed substrate 302 is etched. In step 116, the resist applied in step 104 is removed from the substrate 302. Following the removal of the first coat of resist in step 116, a new coat of photo resist is applied to the substrate 302 in step 118.

The substrate 302, previously exposed using first reticle 200a, is then aligned with second reticle 200b (FIG. 2B) in step 120. In some cases, alignment error may be introduced at this step. The spacing between first lines 202 of reticle 200a of FIG. 2A and second lines 204 of reticle 200b of FIG. 2B is dependent on this alignment.

In step 122, the substrate 302 is exposed with second reticle 200b. In this example, reticle 200b is aligned with section A of substrate 302 in step 120 and is used to expose section A in step 122. The substrate 302 is then moved to section B of substrate 302. Reticle 200b then is used to expose section B. As shown in FIG. 3B, the exposure using first reticle 200a (step 108) and then using second reticle 200b (step 122) yields a more dense line pattern. The remaining sections C through P of substrate 302 are exposed using reticle 200b as shown in FIG. 3C.

In step 124, the exposed substrate 302 is removed from the stepper/scanner and baked. In step 126, the substrate 302 is developed. In step 128, the developed substrate 302 is etched. In step 130, the resist applied in step 118 is removed from substrate 302. In step 132, the main etch is completed, followed by a post-clean etch in step 134.

The method 100 ends at step 136.

Note that in FIGS. 3A-3C, patterns produced by reticle 200a and 200b do not extend to the edge of the substrate 302. In practice, the reticles 200a-b may be positioned so as to at least partially extend over the edge of the substrate 302 so that more of the substrate 302 is patterned (e.g., a "shot" pattern for the reticles may extend over an edge of the substrate 302 so that partial shots of the reticles extend to the edge of the substrate 302).

Figure 4:
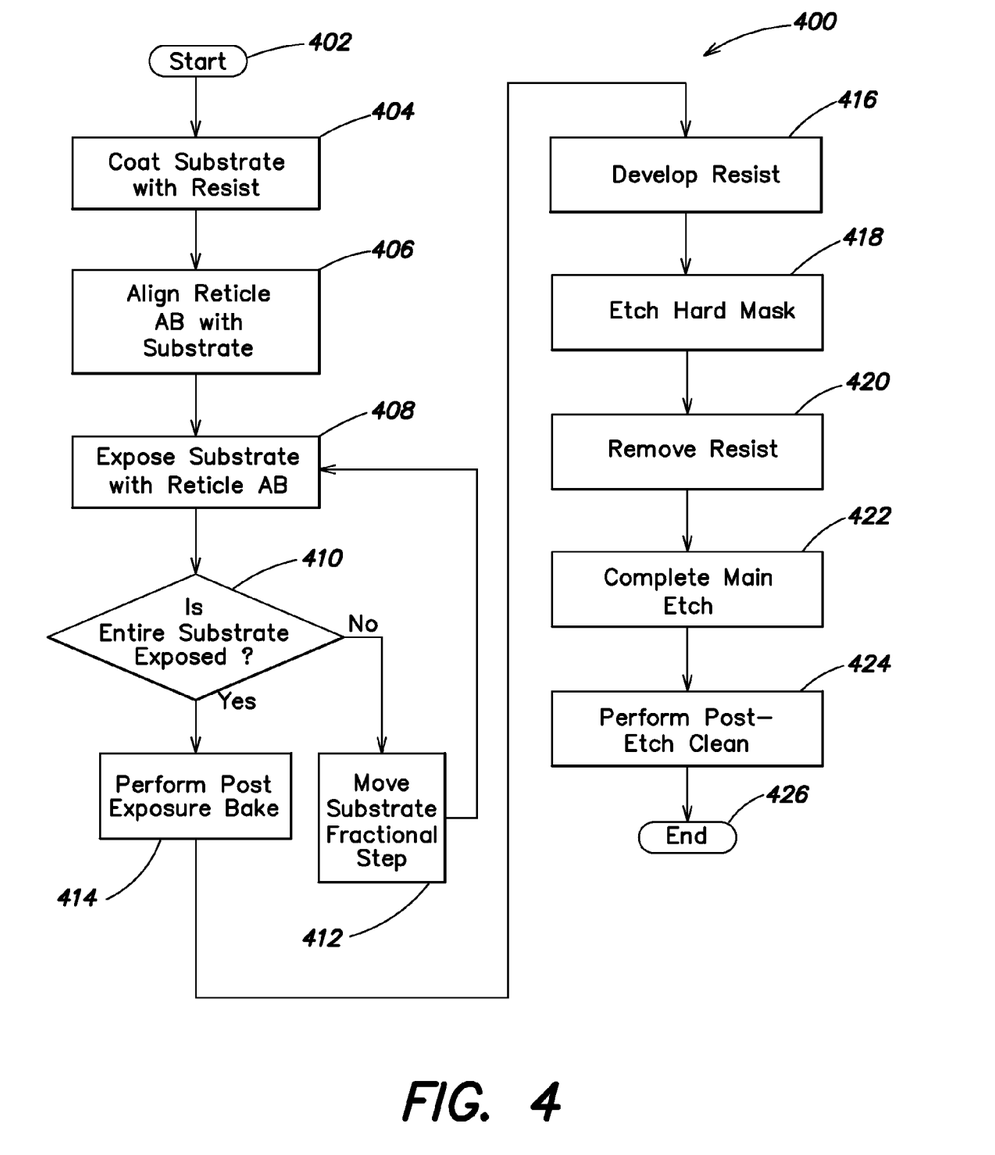
FIG. 4 is a flowchart of an exemplary method of performing a multi-exposure patterning process in accordance with the present invention.
Figure 5:
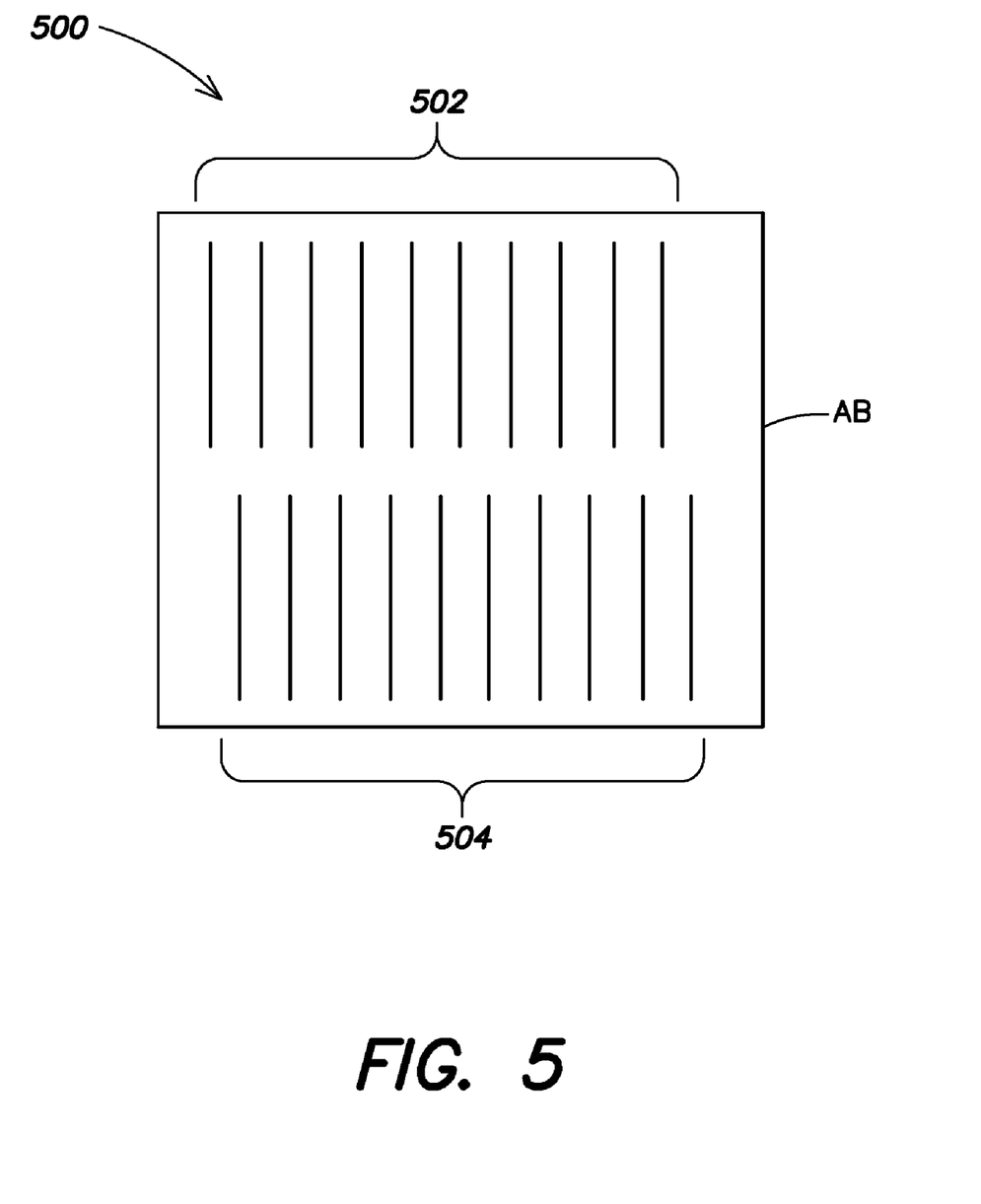
FIG. 5 is a top view of an exemplary multi-pattern multi-exposure reticle provided in accordance with the present invention that may be used during the method of FIG. 4.

The present invention improves over the method 100 as will be shown in FIGS. 4-6D. FIG. 4 is a flowchart of an exemplary method 400 of performing a multi-exposure patterning process in accordance with the present invention. FIG. 5 is a top view of an exemplary multi-pattern multi-exposure reticle 500 provided in accordance with the present invention that may be used during the method 400 of FIG. 4. FIGS. 6A-D are top views of a substrate 602 during performance of the method 400 of FIG. 4.

With reference to FIG. 4, the method 400 begins at step 402. In step 404, a substrate, such as the substrate 602 of FIGS. 6A-6D, may be coated with photo resist in a similar fashion to coating substrate 302 in step 104 above. Any appropriate method and/or tools for coating the substrate 602 with resist may be used.

Following resist coating in step 404, the substrate 602 may be loaded into a stepper/scanner (not shown) and a multi-pattern multi-exposure (MPME) reticle (e.g., mask) may be aligned with the substrate (step 406). In some embodiments, the MPME reticle may be reticle 500 of FIG. 5.

MPME reticle 500 may have multiple patterns inscribed thereon and may be reusable for multiple exposures. In the exemplary embodiment of FIG. 5, MPME reticle 500 has two patterns 502, 504 (e.g., two sets of lines) disposed adjacent one another. In this example, first pattern 502 of reticle 500 may be similar in number, spacing, and/or dimension to lines 202 of first reticle 200a in FIG. 2A; and second pattern 504 of reticle 500 may be similar in number, spacing, and/or dimension to lines 204 of second reticle 200b in FIG. 2B. Accordingly, one MPME reticle 500 may have all of the patterns of non-MPME reticles 200a and 200b and the patterns 502, 504 may be aligned (e.g., offset) in a manner consistent with the alignment of the lines 202 of first reticle 200a to the lines 204 of second reticle 200b. For example, when first pattern 502 is placed atop second pattern 504, the lines of the overall resultant pattern are spaced equally apart at ½ the distance between the lines of pattern 502 and/or 504.

Though described herein as a two-pattern MPME reticle, it is understood that the reticle 500 may contain any number of patterns (e.g., 3, 4, 5, etc.). Also, the patterns 502, 504 may be arranged in any manner on the reticle 500, such as above and below each other as pictured in FIG. 5 and/or side-by-side (e.g., second pattern 504 to the right of first pattern 502 or vice versa). Additionally, any number of lines may be used within a pattern at any appropriate spacing. The patterns 502, 504 may be arranged in any fashion on reticle 500, such as vertically, horizontally, diagonally, etc.

Figure 6A:
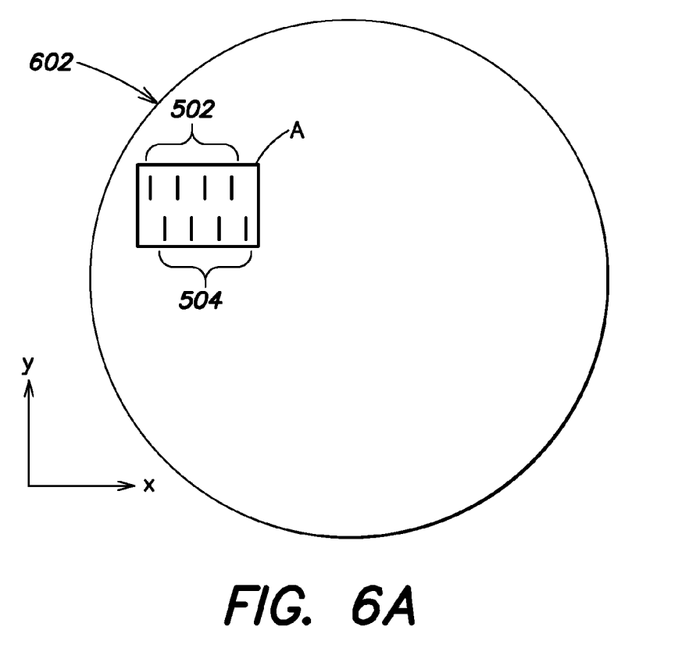
FIGS. 6A-D are top views of a substrate during performance of the method of FIG. 4.

In step 408, the substrate 602 is exposed with multi-pattern-multi-exposure (MPME) reticle 500 in a first position A as shown in FIG. 6A. Any suitable substrate position may be used. After exposure, in step 410 a determination is made whether additional positions on the substrate 602 are to be exposed. If so, the method 400 proceeds to step 412; otherwise, the method 400 proceeds to step 414.

Figure 6B:
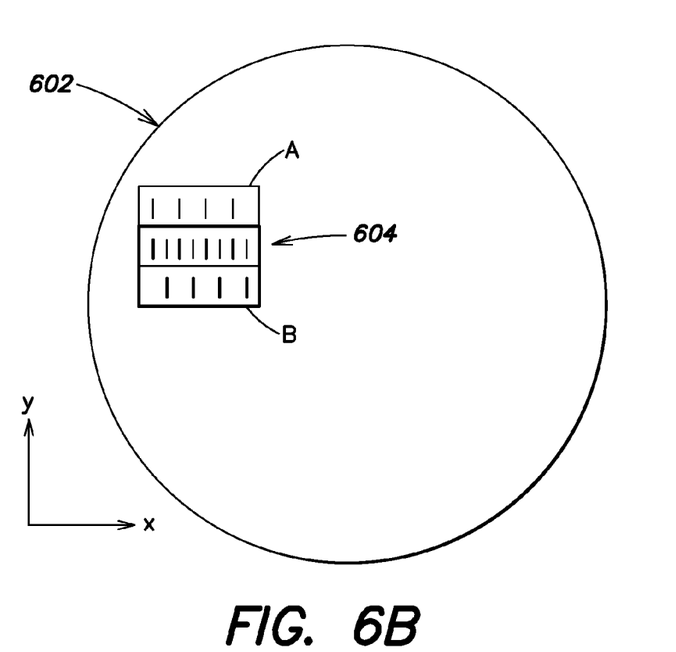

In step 412, the stepper/scanner moves the substrate 602 by less than the field size of reticle 500 so that the reticle 500 resides at a position B (e.g., the substrate 602 is moved in the positive Y direction as indicated by the X-Y axis of FIGS. 6A and 6B). This sub-field-size movement is in contrast to moving the substrate by the entire reticle field size as in a conventional multi-exposure patterning process. In the exemplary embodiment of FIGS. 4-6D, the stepper/scanner may move the substrate by ½ the field size of reticle 500. In general, the substrate 602 may be moved by a distance related to the inverse of the number of patterns on the MPME reticle 500 (e.g., ½ of the reticle field size for two patterns, ⅓ of the reticle field size for 3 patterns, etc.).

Following step 412, the method 400 returns to step 408 and substrate 602 is then exposed with the reticle 500 in the second position B, as shown in FIG. 6B. The new placement of MPME reticle 500 is shown in bold in FIG. 6B to differentiate from the initial exposure at position A. It is noted that the first pattern 502 of reticle 500 now overlaps the area exposed with the second pattern 504 during the first exposure (as indicated by reference numeral 604). In this way, the lines of first pattern 502 may be interleaved between the lines of second pattern 504 on the surface of substrate 602.

After the second exposure (FIG. 6B), in step 410, a determination is made whether additional positions on the substrate 602 are to be exposed. If so, the method 400 proceeds to step 412; otherwise, the method 400 proceeds to step 414. Because the entire substrate 602 has not been exposed, in step 412 the stepper/scanner may again move the substrate 602 by less than the field size of multi-pattern-multi-exposure (MPME) reticle 500, such as in the positive Y direction as indicated by the X-Y axis of FIGS. 6A-6C, to a new position C. Accordingly, reticle 500 may then be positioned one full reticle field size in the negative Y direction from the initial alignment position A of FIG. 6A. The new (e.g., third) placement of reticle 500 is shown in bold in FIG. 6C to differentiate from the initial position A and second position B. It is noted that the first pattern 502 of reticle 500 now overlaps the area exposed with the second pattern 504 during the second exposure. In this way, the lines of first pattern 502 may be interleaved between the lines of second pattern 504 on the surface of substrate 602.

Figure 6C:
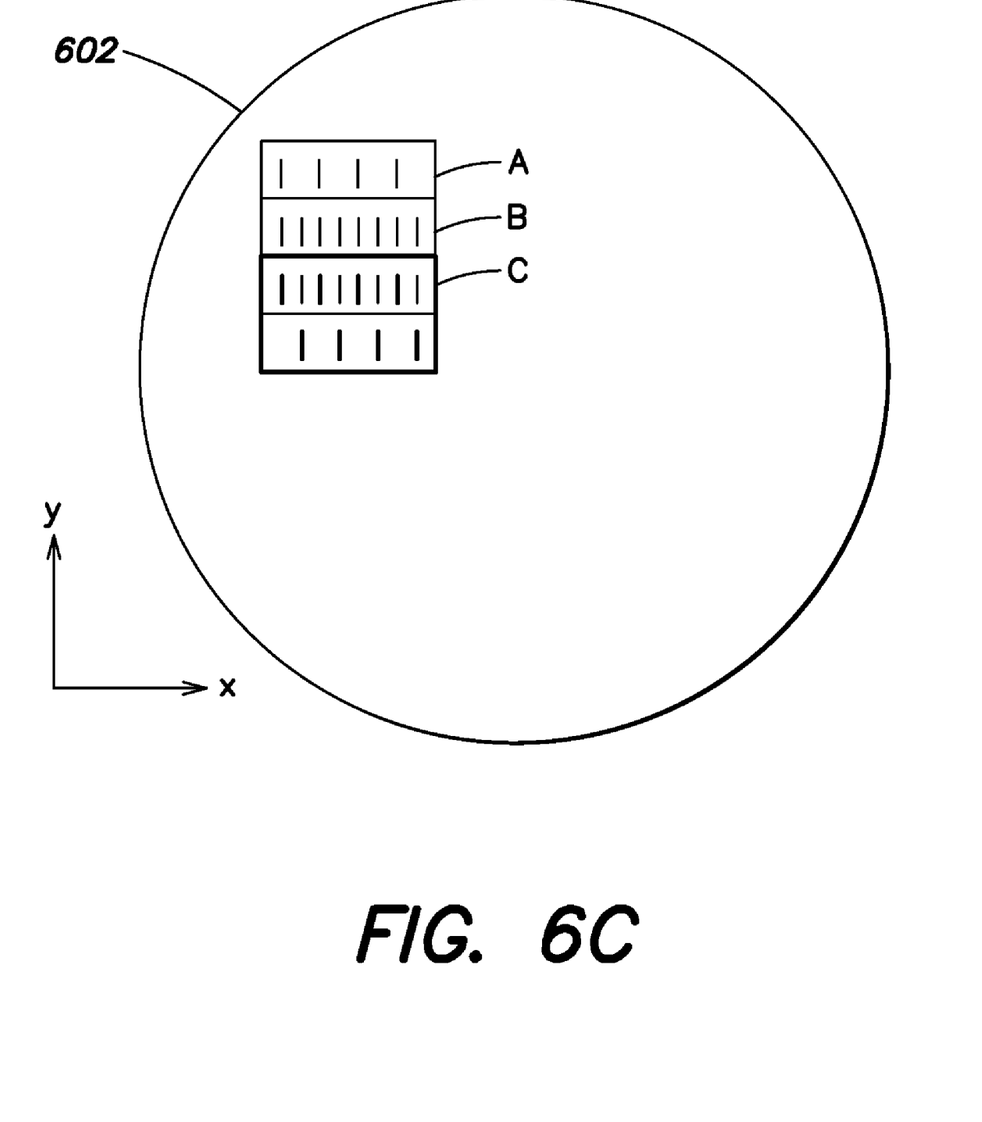

The method 400 again returns to step 408 and substrate 602 is exposed with the multi-pattern-multi-exposure (MPME) reticle 500 in the third position C, as shown in bold in FIG. 6C.

Figure 6D:
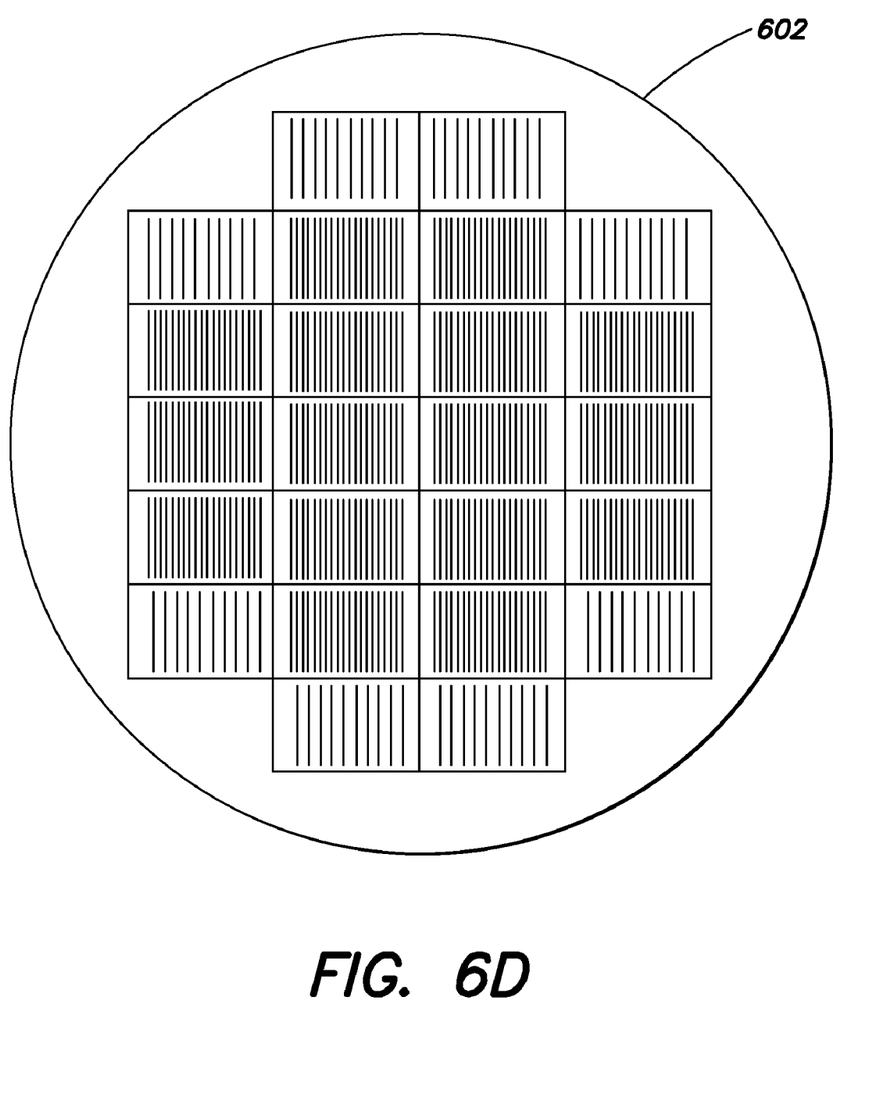

Method steps 410, 412 and 408 may be repeated and MPME reticle 500 may be used to expose the entire substrate 602 as shown in FIG. 6D. It is noted that the stepper/scanner may be used to move the substrate 602 in any appropriate direction and by any appropriate amount to position the substrate 602 beneath reticle 500. For example, following the exposure of a column as shown in FIGS. 6A-6C, the stepper/scanner may move the substrate 602 in the negative X direction, as indicated by the X axis in FIGS. 6A-C, by the X-axis length of reticle 500 to position the reticle 500 in a new column. In the same or alternative embodiments, the stepper/scanner may also move the substrate 602 in the positive Y direction, as indicated by the Y axis in FIGS. 6A-C, to more fully expose the periphery of the substrate 602 as seen in FIG. 6D. In still other embodiments, the stepper/scanner may move the substrate 602 along the X axis before shifting along the Y axis. Other schemes of motion may be used.

In step 414, the exposed substrate 602 is removed from the stepper/scanner and baked. In step 416, the substrate 602 is developed. In step 418, the developed substrate 602 is etched. In step 420, the resist applied in step 404 is removed from substrate 602. In step 422, the main etch is completed, followed by a post-clean etch in step 424.

The method ends at step 426.

Note that in FIGS. 6A-6D, the patterns produced by reticle 500 do not extend to the edge of the substrate 602. In practice, the reticle 500 may be positioned so as to at least partially extend over the edge of the substrate 602 so that more of the substrate 602 is patterned (e.g., a "shot" pattern for the reticle may extend over an edge of the substrate 602 so that partial shots of the reticle extend to the edge of the substrate 602).

The present invention may provide improvement over prior multi-exposure patterning techniques such as double exposure, triple exposure, quadruple exposure, etc., in that the multi-pattern-multi-exposure (MPME) reticle of the present invention is aligned to a substrate only once. The MPME reticle includes all patterns (e.g., lines) required for a multi-exposure patterning process so that a substrate may simply be moved beneath the MPME reticle by a stepper/scanner between exposure steps to allow the substrate to be exposed to each pattern of the multi-exposure patterning process (e.g., double exposure, triple exposure, quadruple exposure etc.). In conventional multi-exposure patterning processes, multiple reticles must be aligned with a substrate as each reticle includes only one pattern. Generally, the alignment of multiple patterns within a single reticle to a substrate by a stepper/scanner is more accurate than the alignment of multiple reticles to the substrate.

Further, the present invention may reduce the number of process steps used during multi-exposure patterning when compared to prior methods of multi-exposure patterning (e.g., by reducing the number of photoresist coating, baking and/or developing steps). For example, in some embodiments, only a single photoresist coating, developing, pre-baking, post-baking, etching and/or resist stripping step may be required to define a multi-exposure pattern on a substrate. The present invention may also reduce the time from exposure until post-exposure bake, thereby improving critical dimension ("CD"). For example, because a substrate is exposed to all of the patterns of the inventive MPME reticle without having to align the substrate to multiple reticles, the time until post-exposure bake when an MPME reticle is employed is similar to the time until post-exposure bake for a conventional single exposure process.

The foregoing description discloses only exemplary embodiments of the invention. Modifications of the above disclosed apparatus and methods which fall within the scope of the invention will be readily apparent to those of ordinary skill in the art. For instance, in some embodiments, it may be desirable to (or a stepper/scanner may only be able to) move a reticle by a full field size between exposures (e.g., "full shot stepping"). In such cases, a first exposure sequence may be performed in which the substrate 602 is fully exposed using a full field size movement of the MPME reticle between exposures. Thereafter, a second, "offset" exposure sequence may be performed in which the starting position of the second exposure sequence is offset relative to the starting position of the first exposure sequence. For example, during the second exposure sequence, the substrate 602 may be fully exposed using a full field size movement of the MPME reticle between exposures, but with the starting position of the second exposure sequence offset relative to the starting position of the first exposure sequence by ½, ⅓, ¼, etc., of the reticle field size (depending on the number of patterns present on the MPME reticle). The above process may be repeated for each pattern present on the MPME reticle. In this manner, the substrate 602 is exposed to all patterns on the MPME reticle. An exemplary exposure process is as follows:

align MPME reticle with substrate at first shot location;
expose substrate;

move substrate by full field size of reticle;
expose substrate;
repeat (3)-(4) to fully expose substrate;
return to first shot location, offset by ½ the reticle field size for a 2 pattern MPME reticle, offset by ⅓ the reticle field size for a 3 pattern MPME reticle, etc.;
expose substrate;
move substrate by full field size of reticle;
repeat (7)-(8) to fully expose substrate; and
perform additional offset exposure sequences if needed.

In some embodiments, a substrate may be aligned with a reticle by aligning the reticle to the exposure tool (e.g., stepper/scanner), such as to an optical column of the exposure tool. The substrate is also aligned to the exposure tool (e.g., the optical column of the exposure tool). The reticle and substrate thereby are aligned, such as relative to a previous pattern on the substrate. For a first level exposure, alignment steps may be eliminated (e.g., some or all of the alignment steps described above and/or in flowcharts).

In some embodiments, the MPME processes described herein may be employed for patterns requiring openings in a mask chrome, such as contact holes or lines in a Damascene process. For example, openings in the chrome, and hence the resist, where lines are to be positioned may be formed using positive photoresist. For negative photoresist, the above approach may be used with Active and/or Gate patterns. If a normal mask and positive resist for Active and/or Gate are employed, the open areas may have resist exposed at locations in which the second set of lines are desired. In some embodiments, a reticle may be moved in place of or in additional to a substrate between exposure steps. Further, the substrate may be positioned above, below, to a side of or otherwise near and/or relative to the reticle depending on the orientation of the reticle (e.g., down, up, vertical, etc.). In one or more embodiments, the MPME reticle may include a plurality of offset and/or identical patterns.

Accordingly, while the present invention has been disclosed in connection with exemplary embodiments thereof, it should be understood that other embodiments may fall within the spirit and scope of the invention.

The invention claimed is:

1. A method of forming a patterned region on a substrate using a multi-pattern, multi-exposure patterning process comprising:
providing a reticle having at least a first pattern and a second pattern that are offset on the reticle;
positioning a substrate near the reticle;
exposing the substrate to the first and second patterns using the reticle, thereby defining a first region of the substrate exposed by the first pattern and a second region of the substrate exposed by the second pattern;
adjusting a position of the substrate relative to the reticle by a distance related to the inverse of the number of patterns on the reticle so as to align the second pattern of the reticle to the first region of the substrate exposed by the first pattern of the reticle; and
exposing the substrate to the first and second patterns using the reticle so that the first region of the substrate has been exposed to both the first pattern and the second pattern of the reticle and the second pattern overlaps the first pattern in the first region.

2. The method of claim 1 wherein the first pattern is a first set of lines and the second pattern is a second set of lines.

3. The method of claim 1 wherein the first and second patterns are identical.

4. The method of claim 1 wherein positioning the substrate near the reticle includes positioning the substrate below the reticle.

5. The method of claim 1 wherein positioning the substrate comprises aligning the reticle with the substrate.

6. The method of claim 5 further comprising employing the reticle to overlay multiple patterns on the substrate without requiring the use of multiple reticles.

7. The method of claim 6 further comprising only aligning the reticle with the substrate once to overlay the multiple patterns.

8. The method of claim 1 wherein exposing the substrate includes exposing an entire field of the reticle.

9. The method of claim 1 wherein adjusting the position of the substrate comprises moving the substrate.

10. The method of claim 1 wherein adjusting the position of the substrate comprises moving the substrate by ½ of a field size of the reticle.

11. The method of claim 1 wherein the reticle includes all patterns required for the multi-exposure patterning process.

12. The method of claim 1 further comprising only performing a single photoresist coating, developing, pre-baking, post-baking, etching or resist stripping step to define a multi-exposure pattern on the substrate.

* * * * *